(12) United States Patent
Cremades Rodriguez et al.

(10) Patent No.: US 10,811,558 B2
(45) Date of Patent: Oct. 20, 2020

(54) ORGANIC-INORGANIC HYBRID MATERIAL AND METHOD FOR SILICON SURFACE PASSIVATION

(71) Applicants: Institutt for Energiteknikk, Kjeller (NO); Universidad Complutense de Madrid, Madrid (ES)

(72) Inventors: Ana Cremades Rodriguez, Madrid (ES); Chang Chuan You, Kjeller (NO); David Maestre Varea, Madrid (ES); Erik Stensrud Marstein, Skedsmokorset (NO); Geraldo Cristian Vasquez Villanueva, Madrid (ES); Halvard Haug, Kjeller (NO); Javier Piqueres De Noriega, Madrid (ES); Jose Maria Gonzalez Calbet, Madrid (ES); Julio Ramirez Castellanos, Madrid (ES); Maria Taeno Gonzalez, Madrid (ES); Miguel Garcia Tecedor, Madrid (ES); Smagul Karazhanov, Kjeller (NO)

(73) Assignees: INSTITUTT FOR ENERGITEKNIKK, Kjeller (NO); UNIVERSIDAD COMPLUTENSE DE MADRID, Madrid (ES)

( * ) Notice: Subject to any disclaimer, the term of this patent is extended or adjusted under 35 U.S.C. 154(b) by 0 days.

(21) Appl. No.: 16/317,135

(22) PCT Filed: Jun. 22, 2017

(86) PCT No.: PCT/EP2017/065449
§ 371 (c)(1),
(2) Date: Jan. 11, 2019

(87) PCT Pub. No.: WO2018/010935
PCT Pub. Date: Jan. 18, 2018

(65) Prior Publication Data
US 2019/0319161 A1    Oct. 17, 2019

(30) Foreign Application Priority Data

Jul. 11, 2016    (NO) ................................. 20161150

(51) Int. Cl.
*H01L 31/18*    (2006.01)
*H01L 31/04*    (2014.01)
(Continued)

(52) U.S. Cl.
CPC ............ *H01L 31/1868* (2013.01); *C09D 5/24* (2013.01); *C09D 7/45* (2018.01); *C09D 7/61* (2018.01);
(Continued)

(58) Field of Classification Search
CPC . H01L 31/04; H01L 31/1868; H01L 51/0003; H01L 51/0037; C09D 7/70;
(Continued)

(56) References Cited

U.S. PATENT DOCUMENTS

2006/0292736 A1* 12/2006 Lee .................... B82Y 10/00
                                                                  438/73
2010/0116527 A1    5/2010 Khosla et al.
(Continued)

FOREIGN PATENT DOCUMENTS

ES          2650213 B2    12/2018

OTHER PUBLICATIONS

Park, Y., et al (PEDOT:PSS with embedded TiO2 nanoparticles as light trapping electrode for organic photovotaics. Applied Physics Letters, vol. 108, 253302-253302-5 (Jun. 24, 2016). (Year: 2016).*
(Continued)

*Primary Examiner* — Caridad Everhart
(74) *Attorney, Agent, or Firm* — Xsensus LLP

(57) ABSTRACT

A relevant technological challenge is the low cost and abundant materials development for silicon surface passi-
(Continued)

vation for applications in optoelectronic devices, in particular in solar cells by scalable industrial methods. In the present invention, a new hybrid material comprising PEDOT:PSS and transparent conducting oxide nanostructures is developed and a method is proposed to fabricate the composite material that passivates well the silicon surface to be used by means of a thin composite film of thickness below 200 nm.

6 Claims, 2 Drawing Sheets

(51) Int. Cl.
    *C09D 5/34*     (2006.01)
    *C09D 165/00*     (2006.01)
    *C09D 7/61*     (2018.01)
    *C09D 7/40*     (2018.01)
    *C09D 7/45*     (2018.01)
    *C09D 5/24*     (2006.01)

(52) U.S. Cl.
    CPC ............... *C09D 7/67* (2018.01); *C09D 7/70* (2018.01); *C09D 165/00* (2013.01); *H01L 31/04* (2013.01)

(58) Field of Classification Search
    CPC ... C09D 7/67; C09D 7/45; C09D 7/61; C09D 165/00; C09D 5/24
    See application file for complete search history.

(56) References Cited

U.S. PATENT DOCUMENTS

2015/0359105 A1* 12/2015 Yoon .................. C09D 139/02
                                                                 174/268
2016/0096967 A1    4/2016   Virkar et al.

OTHER PUBLICATIONS

Office Action issued in Spanish Application 2650213 dated Nov. 13, 2018.
Office Action and Search Report issued in Norwegian Application 20161150 dated Feb. 11, 2017.
Zafar, Q., et al., "Organic-inorganic hybrid nanocomposite for enhanced photo-sensing of PFO-DBT:MEH-PPV:PC71BM blend based photo detector", Journal of Nanoparticle Research, vol. 17, No. 372, 11 Pages total, (Sep. 15, 2015).
Park, Y., et al., "PEDOT:PSS with embedded TiO2 nanoparticles as light trapping electrode for organic photovoltaics", Applied Physics Letters, vol. 108, No. 253302, 6 Pages total, (Jun. 24, 2016).
Olenych, I.B., et al., "Sensory properties of hybrid composites based on poly(3,4-ethylenedioxythiophene)-porous silicon-carbon nanotubes", Nanoscale Research Letters, vol. 10, No. 187, 6 Pages total, (Apr. 1, 2015).
Semaltianos, N.G., et al., "Modification of the electrical properties of PEDOT: PSS by the incorporation of ZnO nanoparticles synthesized by laser ablation", Chemical Physics Letters, vol. 484, pp. 283-289, (Nov. 26, 2009).
Liu, Q., et al., "Effects of molybdenum oxide molecular doping on the chemical structure of poly(3,4-ethylenedioxythiophene):poly(stylenesulfonate) and on carrier collection efficiency of silicon/poly(3,4-ethylenedioxythiophene):poly(stylenesulfonate) heterojunction solar cells", Applied Physics Letters, vol. 102, No. 183503, (May 7, 2013).
Li, J., et al., "On the mechanism of conductivity enhancement in PEDOT/PSS film doped with multi-wailed carbon nanotubes", Journal of Polymer Research, vol. 17, pp. 713-718, (Nov. 25, 2009).
Mucur, S.P., et al., "Enhancing effects of nanoparticles on polymer-OLED performances", Journal of Nanoparticle Research, vol. 14, No. 1214, 11 Pages total, (Sep. 30, 2012).

* cited by examiner

ORGANIC-INORGANIC HYBRID MATERIAL AND METHOD FOR SILICON SURFACE PASSIVATION

CROSS-REFERENCE TO RELATED APPLICATIONS

The present application is based on PCT filing PCT/EP2017/065449, filed 22 Jun. 2017, and claims priority to 20161150, filed in the Norwegian Patent Office on 11 Jul. 2016, the entire contents of each of which being incorporated herein by reference.

FIELD OF THE INVENTION

This invention belongs to the technical field of semiconducting devices and functional coatings. More specifically, it relates to a method for fabrication of a composite layer containing an organic conductor and semiconducting nanostructures (nanoparticles and/or nanowires) as electronic passivation layer of the silicon surface in applications such as solar cells and other silicon-based devices.

DESCRIPTION OF THE RELATED ART

Surface passivation is an outmost important issue in the field of photovoltaic technology in order to achieve a good performance of solar cell devices. (Y. Cao et al., "*The role of surface passivation for efficient and photostable PbS quantum dots solar cells*", Nature Energy 1, 16035 (2016); A. H. Ip et al., "*Hybrid passivated colloidal quantum dot solids*", Nature Nanotechnology 7, 577-582 (2012); B. G. Lee et al., "*Excellent passivation and low reflectivity with atomic layer deposited bilayer coatings for n-type silicon solar cells*", Thin Solid Films 550, 541-544 (2014); Y. Li et al., "*Ultrathin flexible planar crystalline-silicon/polymer hybrid solar cell with 5.68% efficiency by effective passivation*", Applied Surface Science 366, 494-498 (2016)). As for example, advances in passivation obtained in the 80's lead to the successful implementation of the first crystalline silicon solar cells with efficiencies above 20%. Actually, the trends in electronic and optoelectronic devices towards the use of thinner layers of materials as active component make even more relevant the passivation issue at the front and rear surfaces of silicon. At present, $SiN_x$:H, $Al_2O_3$, $SiO_2$ are successful materials used for Si surface passivation. However, high temperature processing associated with deposition of the materials and pretreatment of Si surface with, e.g., hydrofluoric acid (HF), are usually required and this issue raises operational costs and quite inconvenient laboratory conditions. Thus, developing of low temperature passivation methods and materials, involving ease procedure and low costs, are crucial. Polymers have the potential to satisfy the requirement. They can be deposited at room temperature and, upon low processing temperatures, can retain the main functionalities (see, e.g., D. Biro et al., "*Low temperature passivation of silicon surfaces by polymer films*", Solar Energy and Solar Cells 7, 369-374 (2002)). The most commonly used conductive polymer so far is poly(3,4-ethylenedioxythiophene)/poly-(styrene sulfonate) (PEDOT:PSS), which has a high p-type electrical conductivity, anti-reflective coating behaviour, as well as good chemical stability, optical transparency to the visible range and can be easily processed in aqueous solution (e.g. Patents KR101548612 and CN104934540).

Some works (L. He et al., "*High efficiency planar Si/organic heterojunction hybrid solar cells*", Applied Physics Letters 100, 073503 (2012)), reported about very poor Si surface passivation by PEDOT:PSS in the 10.6% high efficiency Si/organic solar cells. High quality passivation of Si surface is reported by R. Yang et al. ("*Organic Vapor Passivation of Silicon at Room Temperature*", Advanced Materials 25, 2078-83 (2013)) to achieve the surface recombination velocity below 10 cm/s, however, chemical vapor deposition method has been used. Passivation of Si surface by polymers other than PEDOT:PSS has been considered by other authors as well. Reference D. Biro et al., ("*Low temperature passivation of silicon surfaces by polymer films*", Solar Energy Materials and Solar Cells 71, 369-74 (2002)) discusses passivation by poly(tetrafluoroethylene) based polymer Nafion® (DuPont) to achieve the surface recombination velocities of as low as 30 cm/s. The reference F. Zhan et al. ("*Methyl/Allyl Monolayer on Silicon: Efficient Surface Passivation for Silicon-Conjugated Polymer Hybrid Solar Cells*", ACS Applied Materials & Interfaces 5, 4678-84 (2013)), reports about Si surface passivation by for Si nanowire-based solar cells with conversion efficiency of 10.2%. There have been some studies about functionalizing PEDOT:PSS by different types of organic surfactants to enhance dispersion of the polymer on Si surface. For example, Reference J. P. Thomas et al. ("*Interfacial micropore defect formation in PEDOT:PSS-Si hybrid solar cells probed by TOF-SIMS 3D chemical imaging*", Anal. Chem. 85, 6840-5 (2013)) used Triton-X100, whereas reference B. Fan et al. "*Novel ways to significantly enhance the conductivity of transparent PEDOT:PSS*" Proc. SPIE 7415, Organic Light Emitting Materials and Devices XIII, 74151Q (2009); doi:10.1117/12.826009 has added cationic and anionic surfactants. Reference J. P. Thomas and K. T. Leung, Adv. Func. Mater. 24, 4978-4985 (2014) added ethylen glycol and dimethyl sulfoxide into PEDOT:PSS to increase its electrical conductivity by defect minimization and achieved high efficiency of 13.3%. The Reference Peichen Yu, Chia-Ying Tsai, Jan-Kai Chang, Chih-Chung Lai, Po-Han Chen, Yi-Chun Lai, Pei-Ting Tsai, Ming-Chin Li, Huai-Te Pan, Yang-Yue Huang, Chih-I Wu, Yu-Lun Chueh, Shih-Wei Chen, Chen-Hsun Du, Sheng-Fu Horng, and Hsin-Fei Meng "*13% Efficiency Hybrid Organic/Silicon-Nanowire Heterojunction Solar Cell via Interface Engineering*", ACS Nano 7, 10780-10787 (2013) has considered the possibility of interface engineering by controlling the energy offset that has led to the enhancement of the charge carrier lifetime. Reference Yingfeng Li, Pengfei Fu, Ruike Li, Meicheng Li, Younan Luo, Dandan Song "*Ultrathin flexible planar crystalline-silicon/polymer hybrid solar cell with 5.68% efficiency by effective passivation*", Applied Surface Science 366, 494-498 (2016) has used amorphous Si between PEDOT:PSS and Si to passivate the Si Surface in the ultrathin flexible planar Si solar cells. Reference Xuegong Yu, Xinlei Shen, Xinhui Mu, Jie Zhang, Baoquan Sun, Lingsheng Zeng, Lifei Yang, Yichao Wu, Hang He, and Deren Yang, Sci. Reports 5, 17371 (2015) "*High Efficiency Organic/Silicon-Nanowire Hybrid Solar Cells: Significance of Strong Inversion Layer*" reported about formation of inversion layer between Si nanowires and PEDOT:PSS that suppresses the charge carrier recombination. Reference Jiang Sheng, Dan Wang, Sudong Wu, Xi Yang, Li Ding, Juye Zhu, Junfeng Fang, Pingqi Gao and Jichun Ye, RSC Adv. 6, 16010 (2016) "*Ideal rear contact formed via employing a conjugated polymer for Si/PEDOT:PSS hybrid solar cells*" used alcohol soluble polymer, poly[(9,9-bis(3'-(N,N-diethylamino)propyl)-2,7-fluorene)-alt-2,7-(9,9-dioctylfluorene)] (PFN) to improve Si/Al interface.

Recently composites made of PEDOT:PSS and inorganic nanostructures have been fabricated with different purposes. The fabrication of PEDOT:PSS-nanoparticle composites has been reported and patented using noble metal nanoparticles, mainly gold or silver, (e.g. Patent KR20140071986, KR20140007082, KR20140132191, CN102875978, JP2012248635, and CN102875978), to enhance the plasmonic effect and to achieve better conductivity. In addition to metallic nanoparticles, semiconducting oxides nanoparticles have been also used in the formation of the composite. In reference S.-J. Wang and H.-H. Park, "*Study of PEDOT: PSS-SnO$_2$ nanocomposite film as an anode for polymer electronics*", Journal of Electroceramics 18, 161-65 (2007), the fabrication of a PEDOT:PSS/tin oxide nanoparticle composite on glass for anode application is reported. Due to the high amount of nanoparticles (till 50% wt of the PEDOT dissolution), the low rotation speed (400 r.p.m.) during spin casting, and the thermal processing in order to eliminate water and other additives used, a grainy thick film of several microns is obtained mainly composed by percolating n-type conducting tin oxide nanoparticles, which reduces the resistivity of the film and shift correspondingly the valence band maximum and the Fermi level from PEDOT:PSS towards the tin oxide values. On the other side, in reference Y. Liu, D. Sun, S. Askari, J. Patel, M. Macias-Montero, S. Mitra, R. Zhang, W.-F. Lin, D. Mariotti and P. Maguire, "*Enhanced Dispersion of TiO$_2$ Nanoparticles in a TiO$_2$/PEDOT:PSS Hybrid Nanocomposite via Plasma-Liquid Interactions*", Scientific Reports 5, 15765 (2015), a fabrication technique of a composite material consisting of nanoparticles with a core of 25 nm size titanium oxide (anatase) and a shell of PEDOT:PSS is reported. The technique is based on a plasma treatment in aqueous solution. In this case the agglomeration of the nanoparticles is reduced due to the nanoparticle surface charge induced by the plasma. However, with this method a continuous and homogeneous composite thin film is not obtained, as it is the case of the composite proposed in the present invention, which also involves easier processing. Another work on TiO$_2$ undoped nanoparticles/PEDOT:PSS composite has been published by K. H. Yoo, K. S. Kang, Y. Chen, K. J. Han and J. Kim, "*The TiO$_2$ nanoparticle effect on the performance of a conducting polymer Schottky diode*", Nanotechnology 19, 505202 (2008). In this case nanoparticles smaller than 40 nm were dispersed PEDOT:PSS in elevated weight ratios up to 20 wt. % to form a Schottky diode structure between aluminum and gold electrodes with a final thickness of the PEDOT:PSS/nanoparticle film of 1 micron, presenting nano and microcracks depending on the final treatment. None of the here-referred works report on the passivation performance of the composite layer, as that described in the present invention. Other related concepts can be found in the use of a multilayer system such as the one released in Patent CN104867678, which reports the fabrication of a tri-layer system comprising PEDOT:PSS, nanometre porous zinc oxide and a compact zinc oxide film for application on a dye-sensitized solar cell. Similarly, one can mention the layer by layer assembly of two different components, an n-type inorganic semiconductor (TiO$_2$ nanoparticle film) and a p-type semiconducting polymer (PEDOT:PSS) reported in reference N. Sakai, G. K. Prasad, Y. Ebina, K. Takada, and T. Sasak, "*Layer-by-Layer Assembled TiO$_2$ Nanoparticle/PEDOT-PSS Composite Films for Switching of Electric Conductivity in Response to Ultraviolet and Visible Light*", Chem. Mater. 18, 3596-98 (2006), or the Patent KR20150084702 and CN20121390201 implementing different solar cells with a hole transport layer comprising PEDOT:PSS and tungsten oxide.

In the present invention, a method to fabricate a hybrid composite based on PEDOT:PSS-nanoparticle and/or nanowires achieving passivation of the Si surface is proposed by means of cost effective materials and techniques, which avoids vacuum-based techniques and complex pretreatments of the Si surface. Several compositions for the composite, containing transparent conductive oxides (TCO), in particular tin oxide and/or titanium oxide in low concentrations, are considered. The use of nanoparticles at limited concentrations (lower than 10% wt. of the PEDOT:PSS solution) is a crucial point of the invention, as this avoids a change in the p-type character of the PEDOT:PSS conductivity while maintaining the transparency, and allowing to obtain adequate passivation of the n type Si surface with thickness below 200 nm. The possibility of fabricating multilayers based in this composite with variable concentrations, types of nanostructures, materials and doping along the multilayer structure widens the applications and the on-demand design of a functional coating with tailored properties. The development of faster process involving low costs, as that described in this invention will ease the implementation and optimization of solar-cells devices.

DETAILED DESCRIPTION OF THE INVENTION

The present invention is directed to the fabrication of a hybrid organic-inorganic film to be used for passivation of Si surface in Si-based devices, in particular, Si-based solar cells, as well as to developing the method of deposition of the hybrid films. The deposition process here used involves rapidity and low costs as compared with other chemical methods employed so far, such as, e.g., chemical vapor deposition (CVD) or plasma enhanced CVD (PECVD). In the embodiments described below, the combination of inorganic transparent conducting oxide (TCO) nanostructures, like tin oxide and titanium oxide (rutile and/or anatase) nanoparticles and/or nanowires, with the organic p-type semiconductor known as PEDOT:PSS results, by spin coating deposition, into a thin film with thickness below 200 nm, preferably in a range of 90-150 nm, even preferably 100-130 nm. Oxide nanostructures might also be replaced by other convenient nanostructures such as carbon nanotubes, Si nanoparticles or nanowires, Al$_2$O$_3$ nanoparticles or nanowires, and SiN$_x$ nanoparticles or nanowires, or a mixture thereof. In comparison to the use of a film made exclusively of PEDOT:PSS, the composite thin film containing nanoparticles improves the passivation properties of the Si surface increasing lifetime of the charge carriers and the conductivity of the layer (as described in embodiment 1), with a slight modification on the light absorption as well.

The SnO$_2$ and TiO$_2$ nanoparticles may be grown by different synthesis routes such as hydrolysis (by using SnCl$_2$.2H$_2$O or Ti(OBu)$_4$ and 1-butanol precursors for the fabrication of tin or titanium oxide nanoparticles respectively), or by a modification of the Pechini Method (as the one followed in patent ES201400759). The dimensions of the nanoparticles range from 1 to a maximum of approximately 80 nm (they should not be larger than the thickness of the spin-coated film), preferably 1 to 65 nm, even preferably 5 to 50 nm.

SnO$_2$ and TiO$_2$ nanowires, grown by a vapour-solid method which avoids the use of catalyst or external substrates, can be also used as filler in the formation of the composite, as described in embodiment 2. Metallic Sn have been used as precursor for the fabrication of SnO$_2$ nanowires, while for the growth of TiO$_2$ nanowires TiN powder has been used as precursor. Temperatures of 800° C. or 900° C. have been used for the fabrication of $SnO_2$ and $TiO_2$ nanowires, respectively, which reach length of hundreds of nm and widths of tens of nm. By length of hundreds of nanometer, we mean from about 10 nm to about 1 000 nm, preferably 50 to 950 nm, even preferably 100 to 900 nm. By widths of tens of nm, we mean from 1 nm to about 100 nm, preferably 10 nm to about 100 nm. Either anatase and/or rutile phases can be used for the titanium oxide nanostructures, whereas rutile is obtained for tin oxide nanostructures. Doping elements may include Cr, Al or Li as acceptors for both $SnO_2$ and $TiO_2$ nanostructures. The dopant concentrations that have been used are 10, 20 and 30% cat. The % of dopant is less than 50%. Although we have worked with a range of 10-30%, a preferred range is of 1-40%, preferably 1-35%, even preferably 1-30%.

The PEDOT:PSS may be used dispersed in water at 1.3% v/v, it presents a sheet resistance below 100 ($\Omega$/sq) and conductivities up to $\sigma$=1000 S/cm. Some additives can be used for different purposes, as described in embodiment 3. In the case of ethylene glycol (EG), it is reported that it improves the electrical conductivity of PEDOT:PSS by aligning the polymer chains. In our case, EG exhibits another interesting property which consists of avoiding the agglomeration of the nanoparticles during spin coating, because this compound acts as a dispersant. Really interesting is as well the use of isopropanol (IPA) before the spin-coating, because this compound helps the deposition on hydrogenated Si, especially after HF cleaning, and improves homogeneity of the deposited layers by making hydrophilic the silicon surface, as described in embodiment 3.

The composition ratio PEDOT:PSS dispersion to nanostructures may be between 0.25 to 5 wt. %, although dispersion in a broader range (0.1-10 wt. %) are also expected to work. This parameter is crucial for the passivation behaviour of the hybrid composite, as life time charge carrier values vary as a function of the concentration of nanostructures in the composited film (as described in embodiment 1).

Dispersions of the nanostructures in PEDOT:PSS have been made in the desired concentrations and under ultrasonication. Once the dispersions were ready, spin-coating was carried out at room temperature and without a need of processing under vacuum. The spin-coating recipe followed in this case consists of three different steps: initialization (500 r.p.m during 2s), covering (3000 r.p.m during 30s) and drying (4000 r.p.m during 40s) Immediately after spin-coating, consequent thermal annealing was performed in order to evaporate water from PEDOT:PSS, which is diluted on it. The thermal annealing was performed at 120° C. during 20 min, and preferred temperatures ranges are 100-130° C. and even preferred 110-125° C. Preferred time ranges are 10-30 min, even preferred 15-25 min.

A single composite layer may be deposited on top of the silicon substrate, and in some embodiments a bilayer or multilayers may be deposited too by repeating the process on a previously spin coated layer, as described in embodiment 4.

EMBODIMENTS OF THE INVENTION

The present invention is additionally illustrated by means of the following embodiments, which are not intended to be limiting its scope.

Embodiment 1

An hybrid composite thin film, is fabricated by PEDOT:PSS combined with tin oxide and/or titanium oxide doped or undoped nanoparticles in different concentrations. In addition to the rutile $SnO_2$ nanoparticles, either rutile or anatase $TiO_2$ nanoparticles can be used, with different properties as a function of the crystalline phase. The $SnO_2$ and $TiO_2$ (rutile) nanoparticles used in this embodiment, with sizes ranging from 5 to 50 nm, have been fabricated by an hydrolysis method, using $SnCl_2.2H_2O$ or $Ti(OBu)_4$ and 1-butanol precursors, respectively. The reduced dimensions of the nanoparticles facilitate their dispersion and deposition by the spin-coating process, which results in a layer with good homogeneity. An image of the composited thin film 125 nm thick spin-coated onto a n-Si substrate containing 0.5% wt. $SnO_2$ nanoparticles is shown in FIG. 1. The spin coating process has been carried out following three different steps described in the section "Detailed description of the invention": initialization, covering and drying. This process is followed by a thermal annealing at 120° C. for 20 min Different concentrations of semiconducting oxide nanoparticles (0.25 to 5% wt.) have been used in the formation of the composite, although a broader range of dispersion (0.1-10% wt.) is also expected to work. Measurements of the carrier lifetime have been performed by using a photoluminescence (PL) imaging system in order to study the surface recombination at the Si surface and thus the passivation behaviour of the composite thin film spin coated on n-Si. A LIS-R1 PL imaging setup from BT Imaging with an excitation wavelength of 808 nm and a constant illumination intensity of $4.2 \times 10^{-2}$ W/cm$^2$ has been used. In this case, a 40 nm thick layer of hydrogenated amorphous silicon (a-Si:H) has been deposited by sputtering on the back side of the Si wafer used as a substrate as a reference passivation layer. The a-Si:H passivated surface has a low surface recombination velocity (SRV) and the Si wafers have a high bulk lifetime of several milliseconds. Hence, the SRV from the front Si surface passivated with pristine PEDOT:PSS could be calculated with a small error. As an example, FIG. 2 shows the carrier lifetime vs. the concentration of nanoparticles when $SnO_2$ is used as filler in the composite. Best results have been achieved when using $SnO_2$ (0.5% wt.) and rutile $TiO_2$ (1% wt) concentrations, which confirms that a control of the composition is crucial for the passivation performance of the hybrid composite thin film. Carrier lifetime values of hundreds of $\mu$s have been achieved. In addition to the undoped nanoparticles, doped nanoparticles can be also employed. As for example, Cr, Al or Li have been used as a dopant in $SnO_2$ and $TiO_2$ (anatase) nanoparticles in a concentration ranging between 10 and 30% cat. The selection of dopants is based on achieving a p-type character for the metal oxide nanoparticles, and therefore the spirit of this embodiment is not limited to the previous selection.

Embodiment 2

$SnO_2$ and $TiO_2$ (rutile) nanowires, with hundreds of nm length and tens of nm width, fabricated by a vapor solid process have been also employed as filler in the composite layer. Tin oxide or titanium oxide nanowires have been fabricated by a vapour-solid method, using metallic Sn or TiN precursors and temperatures of 800° C. or 900° C., respectively. The nanowires show dimensions of hundreds of nm length and tens of nm width. The nanowires have been added to the PEDOT:PSS dispersion in 0.25 to 5% wt. concentrations, although concentrations in a broader range (0.1-10% wt.) are also expected to work. Despite the fact that the carrier lifetime values measured for the nanowires-based composites are lower than those for the nanoparticles, their characteristic morphology can improve some other relevance optical properties for the solar-cell performance, such as the absorbance. In this case the homogeneity of the spin-coated films is not as good as for the nanoparticles, due to the dimensions of the elongated structures which can be easily tangled, thus hindering their dispersion. However, layers with good homogeneity can be also spin coated on a n-Si substrate, by paying special attention to the process and including adequate additives to avoid aggregation such as EG or IPA to facilitate spin coating of PEDOT on Si, as indicated in the embodiment number 3. Upon using the other scalable chemical methods, larger carrier lifetime might be expected. Doped nanowires can be also employed, as described for the nanoparticles in embodiment 1.

Moreover, mixed $SnO_2/TiO_2$ nanoparticles and/or nanowires can be used as filler in the composite in order to exploit the properties of both materials in the design of the passivation layer.

Embodiment 3

In this invention some additives can be added to the organic polymer PEDOT:PSS in order to improve its performance. The use of Ethylene glycol (EG) not only involves an improvement of the electrical conductivity of the polymer, due to alignment of the polymer chains, but also enhances the dispersion of the nanoparticles, which is a relevant parameter to be taken into account. Using EG in a range of concentration of 3-4.5 wt. % as a dispersant avoids the agglomeration of nanoparticles (nanowires) during the spin-coating and results in a higher homogeneity of the composite film. An improvement of the homogeneity of the spin-coated layer has been also achieved by using isopropanol (IPA) and/or standard RCA cleaning (W. Kern and D. Puotinen, *RCA Rev.*, 31, 187 (1970)) before the spin coating process. For the IPA cleaning, the Si substrate is placed on the spinner platform and IPA is dropped covering the Si surface for 90 seconds prior to the PEDOT:PSS deposition. Then, the sample is dried by a conventional spinning process. By using IPA or RCA cleaning procedures the deposition of the layer on Si is improved, as shown in FIG. 3, which also results in a better homogeneity of the film, due to the improvement in the hydrophilic character of the surface. The homogeneity of the passivation layer is improved by adding EG and/or IPA, without detriment in the passivation properties which remains unchanged.

Embodiment 4

As a fourth embodiment, the spin coating technique employed in this invention can be subsequently repeated in order to fabricate multilayer structures. Once a high homogeneous layer is deposited, it can be used as a substrate on top of which a new layer could be deposited. Following this procedure layers with a concentration gradient of TCO nanostructures in PEDOT:PSS can be fabricated, as well as multilayers with tuned optical properties, as an example, making use of the different properties achieved by doping and the combination of materials with different band gaps. This embodiment adds functionality, while keeping high homogeneity in the layers and involving low costs. This can widen the performance and applicability of this invention in the field of solar cells, and other optoelectronic devices.

Figure 1:
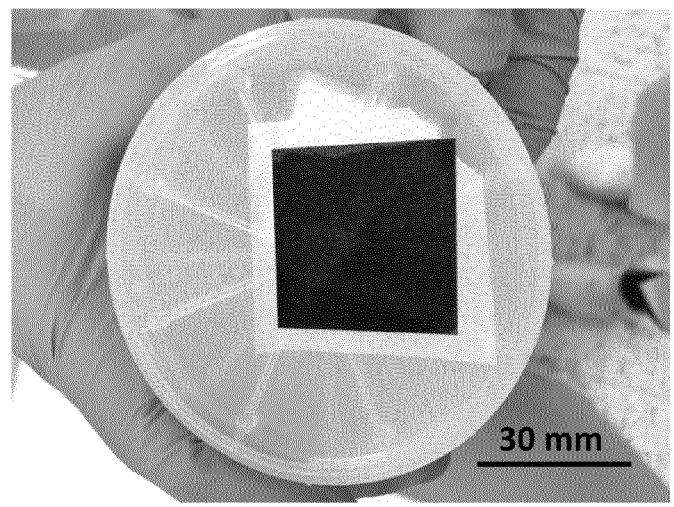
FIG. 1. Optical image of a composite 125 nm thick layer presenting good homogeneity as deposited by spin-coating on a n-Si substrate (3.5×3.5 mm). The layer is composed of PEDOT:PSS and $SnO_2$ nanoparticles in a 0.5% wt. concentration.
Figure 2:
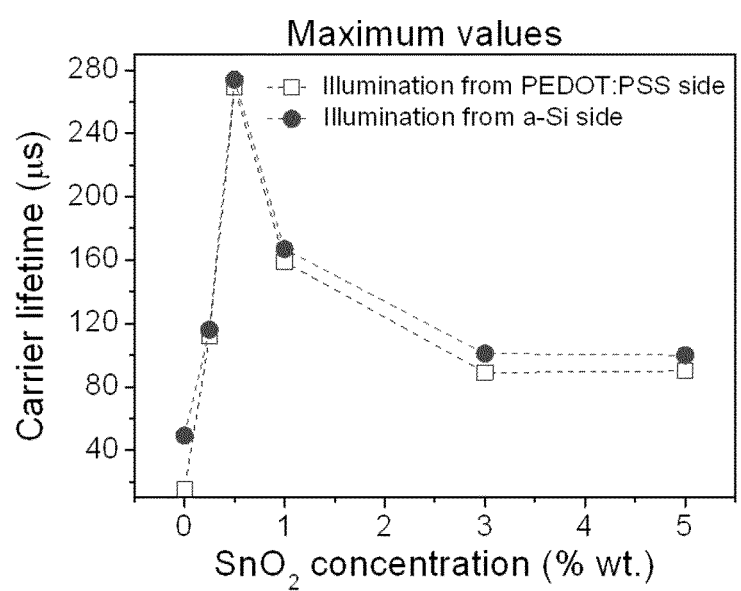
FIG. 2. Life time variation of the charge carriers as a function of the $SnO_2$ nanoparticles concentration at the composite acquired by illumination from the PEDOT:PSS/nanoparticle frontal surface or the a-Si:H back side.
Figure 3:
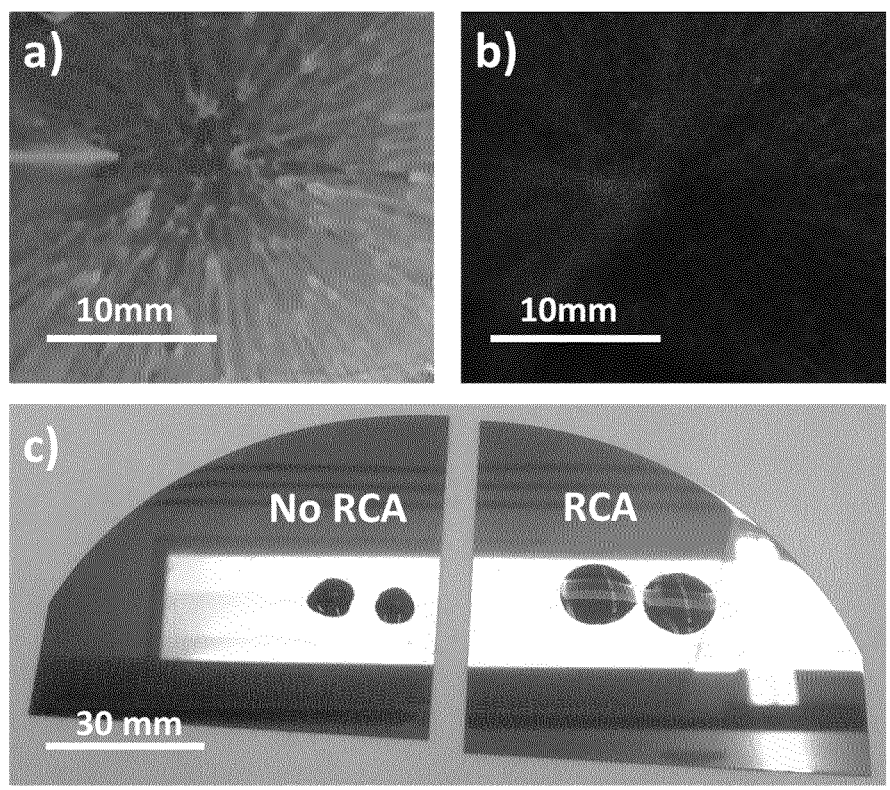
FIG. 3. Optical image of the PEDOT:PSS and $SnO_2$ nanoparticles dispersion spin-coated on (a) n-Si without previous treatment, and (b) n-Si substrate pre-treated with IPA. Better homogeneity is observed in image (b) due to the hydrophilic character of the Si substrate induced by IPA treatment. (c) Image of drops of PEDOT:PSS and $SnO_2$ nanoparticles deposited on n-Si substrates, either cleaned (right) or not (left) by RCA as indicated on the image, inducing the former the hydrophilic property of silicon.

The above described is merely examples of the present invention and they do not intend to limit the present invention. Any modifications and changes without departing from the scope of the spirit of the present invention are deemed as within the scope of the present invention. The scope of the present invention is to be interpreted with the scope as defined in the claims.

The invention claimed is:

1. Hybrid organic-inorganic material consisting of an organic conductor polymer matrix and transparent conducting oxide nanostructures as filler, where the conductive polymer is PEDOT:PSS and the nanostructures are dispersed in the polymer in a ratio of 0.1-10% wt., wherein the hybrid organic-inorganic material having tin and/or titanium oxide nanoparticles undoped or doped with Cr, Al, or Li with a cationic percentage range of 1 to 40%, and the nanoparticles have sizes between 1-65 nm.

2. Hybrid organic-inorganic material consisting of an organic conductor polymer matrix and transparent conducting oxide nanostructures as filler, where the conductive polymer is PEDOT:PSS and the nanostructures are dispersed in the polymer in a ratio of 0.1-10% wt., the hybrid organic-inorganic material further having tin and/or titanium oxide nanowires undoped or doped with Cr, Al, or Li with a cationic percentage range of 1 to 40%, and the nanowires have sections of up to a 100 nm and lengths of up to 1000 nm.

3. The hybrid organic-inorganic material, as claimed in claim 1, having a mixture with controlled ratios of the tin and/or titanium oxide nanoparticles and/or the tin and/or titanium oxide nanowires.

4. The hybrid organic-inorganic material, as claimed in claim 1, having other filler such as carbon nanotubes, Si nanoparticles or nanowires, $Al_2O_3$ nanoparticles or nanowires, and $SiN_x$ nanoparticles or nanowires, or a mixture thereof.

5. The hybrid organic-inorganic material, as claimed in claim 1, having Ethylene Glycol as dispersant added to the dispersion of the organic conductor.

6. A method for fabricating a hybrid composite containing an organic conductor as host and semiconducting nanostructures as filler, comprising at least the steps of:
   providing an aqueous dispersion of a conductive polymer,
   providing transparent conducting oxide nanostructures with controlled size and doping by techniques such as hydrolysis, modified Pechini method or vapour-solid method, and
   adding the nanostructures in the ratios lower than 10% wt., at the aqueous dispersion under ultra-sonication, wherein the nanostructures including tin and/or titanium oxide nanostructures undoped or doped with Cr, Al, or Li with a cationic percentage range of 1 to 40%, and the nanostructures have sizes between 1-65 nm.

* * * * *